(12) United States Patent
Fogg et al.

(10) Patent No.: US 7,708,564 B2
(45) Date of Patent: May 4, 2010

(54) METHOD AND APPARATUS FOR PROVIDING SYMMETRICAL SIGNAL RETURN PATH IN DIFFERENTIAL SYSTEMS

(75) Inventors: Michael Warren Fogg, Harrisburg, PA (US); Steven Jay Millard, Mechanicsburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 12/319,837

(22) Filed: Jan. 13, 2009

(65) Prior Publication Data

US 2009/0124103 A1 May 14, 2009

Related U.S. Application Data

(62) Division of application No. 11/224,533, filed on Sep. 12, 2005, now Pat. No. 7,497,703.

(51) Int. Cl.
*H01R 12/00* (2006.01)

(52) U.S. Cl. .......................... 439/65; 174/261

(58) Field of Classification Search ................. 174/261; 439/76.1, 108, 65, 620.13; 361/794
See application file for complete search history.

(56) References Cited

U.S. PATENT DOCUMENTS

| | | | |
|---|---|---|---|
| 6,431,887 B1 * | 8/2002 | Yeomans et al. | 439/108 |
| 6,485,315 B1 * | 11/2002 | Hwang | 439/108 |
| 7,244,126 B2 * | 7/2007 | Morana et al. | 439/76.1 |
| 2002/0151206 A1 * | 10/2002 | Yeomans et al. | 439/352 |
| 2007/0187141 A1 * | 8/2007 | Bartholomew | 174/261 |

* cited by examiner

*Primary Examiner*—Briggitte R Hammond

(57) ABSTRACT

A circuit board and connector for use in an electrical connector has been provided. The circuit board comprises first and second signal contacts associated as a differential pair. A ground contact is located immediately adjacent the first signal contact and is joined directly to a ground plane provided within the circuit board. A floated contact is located immediately adjacent the second signal contact. A component interconnects the floated contact to the ground plane, forming an open circuit when a DC signal is impressed on the floated contact and a closed circuit when AC interference is impressed on the floated contact.

10 Claims, 7 Drawing Sheets

METHOD AND APPARATUS FOR PROVIDING SYMMETRICAL SIGNAL RETURN PATH IN DIFFERENTIAL SYSTEMS

CROSS-REFERENCE TO RELATED APPLICATIONS

This application is a division of application Ser. No. 11/224,533, filed Sep. 12, 2005 now U.S. Pat. No. 7,497,703.

BACKGROUND OF THE INVENTION

This invention relates generally to a connector for electronic equipment, and more particularly, to connectors and circuit boards for transmitting and receiving differential signal pairs.

Numerous types of connectors and circuit boards exist today for conveying differential signal pairs. Differential signal pairs include complementary signals such that if one signal in a differential pair switches from 0 V to 1 V, the other signal in the differential pair switches from 1 V to 0 V. By way of example, differential signals are used today in high speed serial data connectors (sometimes referred to as "HSSDC"). Certain conventional connector and circuit board arrangements utilize a contact or signal trace layout in which a first differential pair is defined as a "transmit differential pair" and a second differential pair is defined as a "receive differential pair". The contacts for transmit and receive differential pairs are separated by a central ground contact. In the past, ground contacts were also positioned along outer sides of the contacts for transmit and receive differential pairs, thereby creating a balanced contact arrangement by locating ground contacts on both sides of the transmit differential pair contacts and on both sides of the receive differential pair contacts.

Recently, it has been proposed to modify the connectors and circuit boards to cease using the outer contacts as dedicated ground contacts. Instead, it has been proposed to use the outer contacts for other functions.

However, disconnecting the outer contacts from the ground plane has been found to create certain problems with signal transmission at high data rates, such as 1 Gbps and higher. In the above-described balanced conventional arrangement, positioning the transmit and receive differential pair contacts between corresponding ground contacts created a balanced or symmetric contact arrangement to afford a line of symmetry between the two contacts within the transmit differential pair and a line of symmetry between the two contacts within the receive differential pair. Thus, contacts of each differential pair were held in a balanced ground environment. Each signal contact creates an electromagnetic (EM) field as the signal is conveyed therethrough. In a balanced ground environment, the EM fields created by the contacts of a differential pair are equal and opposite. Thus the EM fields of the contacts of a differential pair are cancelled out in a balanced ground environment.

However, when the outer contacts are modified to no longer constitute dedicated ground contacts, the ground environment symmetry is eliminated. When the ground environment becomes asymmetric, the EM fields generated and experienced by each contact within a differential pair become asymmetric. As signals are conveyed through the contacts of a differential pair and are exposed to different EM fields, the signals become unbalanced. When transmitting at high speeds, the asymmetry negatively impacts various signal characteristics, such as increased EM interference, increased differential insertion loss, increased jitter, creating mismatch in the AC return path, introducing common mode energy, creating an unbalanced or common mode signal, and the like. The reduction in signal performance becomes quite noticeable at higher and higher data rates, such as over 4 Gbps.

Therefore, a need exists to provide symmetry for a connector assembly or circuit board that utilizes differential pairs, while still providing the ability to utilize non-signal contacts for functions other than being dedicated to ground. Certain embodiments of the present invention are intended to meet these needs and other objectives that will become apparent from the description and drawings set forth below.

BRIEF DESCRIPTION OF THE INVENTION

In one embodiment, a circuit board comprises first and second signal contacts associated as a differential pair and a ground plane. A ground contact is located immediately adjacent the first signal contact and is joined directly to the ground plane. A floated contact is located immediately adjacent the second signal contact. A component interconnects the floated contact to the ground plane, forming an open circuit when a DC signal is impressed on the floated contact, and a closed circuit when AC interference is impressed on the floated contact.

In another embodiment, a connector assembly comprises a housing having a cable receiving end and a mating end. The cable receiving end is configured to be joined to a cable and the mating end is configured to be received in a mating connector. First and second signal contacts are held in the housing and associated as a differential pair. A ground contact is held in the housing and located immediately adjacent the first signal contact. The ground contact is configured to be joined directly to a ground plane. A floated contact is held in the housing and located immediately adjacent the second signal contact. A component interconnects the floated contact to the ground plane, forming an open circuit when a DC signal is impressed on the floated contact and a closed circuit when AC interference is impressed on the floated contact.

The foregoing summary, as well as the following detailed description of certain embodiments of the present invention, will be better understood when read in conjunction with the appended drawings. It should be understood that the present invention is not limited to the arrangements and instrumentality shown in the attached drawings.

DETAILED DESCRIPTION OF THE INVENTION

Figure 1:
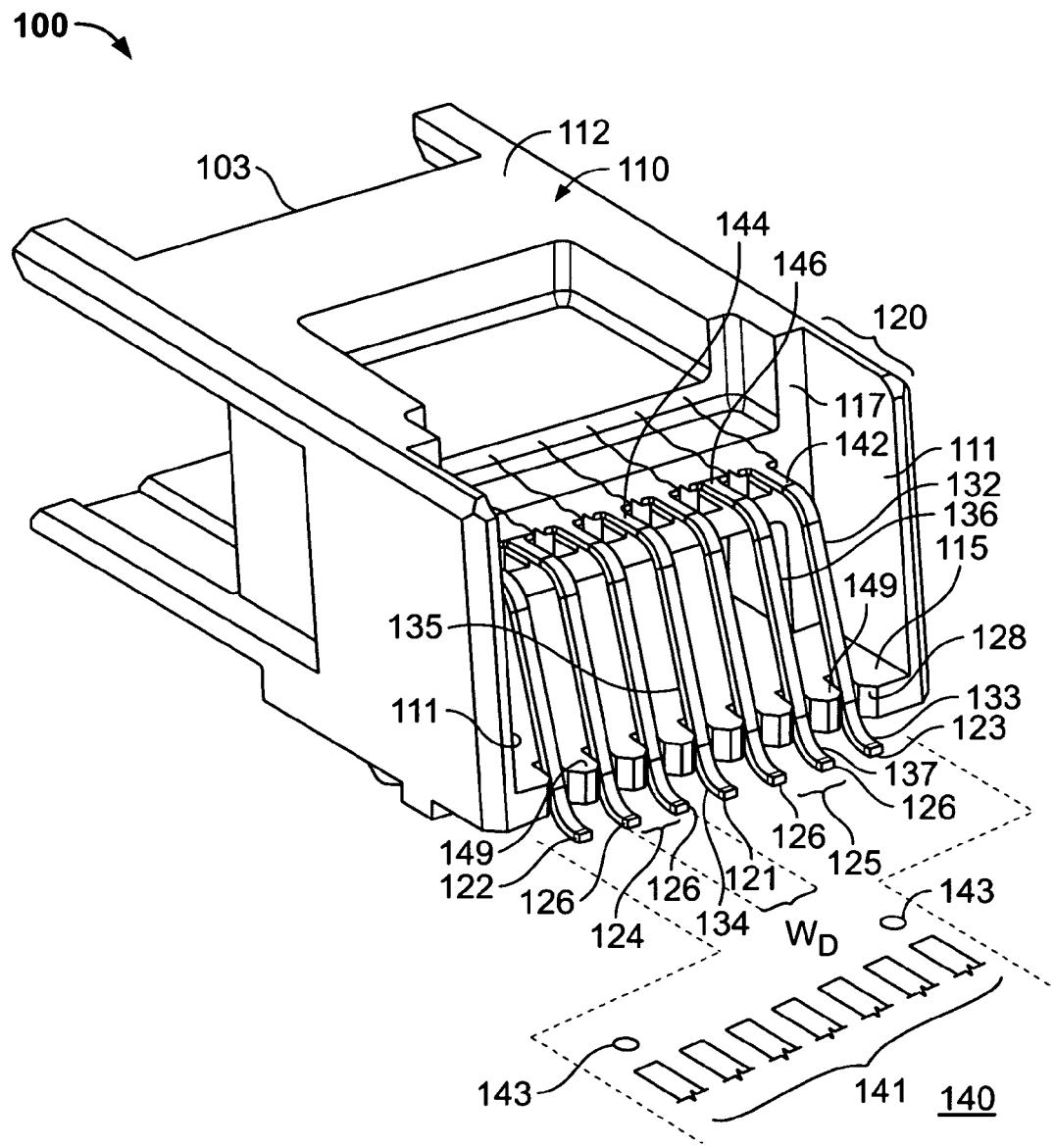
FIG. 1 is an isometric view of a receptacle connector formed in accordance with an embodiment of the present invention.

FIG. 1 is an isometric view of a receptacle connector 100 formed in accordance with an embodiment of the present invention. The receptacle connector 100 includes a housing 110 having a main body 112, sidewalls 111, a back wall 117 and a base 115 that define a cavity 120 at an open face of the housing 110. Contact passages 128 are formed in the open end of the base 115.

Ground contact 121 extends from the back wall 117 and includes an elongated central arm 135 with an arc shaped ground contact tail 134 at a terminal end. The ground contact 121 also includes a ground contact section 144 at the upper end opposite that of the arc shaped ground contact tail 134. Floated contacts 122 and 123 extend from the back wall 117. Each includes an elongated central arm 132 and an arc shaped floated contact tail 133 at a terminal end. The floated contacts 122 and 123 also each include a floated contact section 142 at the upper end opposite that of the arc shaped floated contact tail 133. Similarly, signal contacts 126 extend from the back wall 117. Each includes an elongated central arm 136, an arc shaped signal contact tail 137 at a terminal end, and a signal contact section 146. Each of the ground contact tail 134, floated contact tails 133 and signal contact tails 137 form an electrical connection with pins or contacts forming a contact pattern 141 on a circuit board 140. The contact pattern 141 will be discussed further below.

Signal contacts 126 are arranged with two (2) signal contacts 126 being adjacent one another, thereby forming differential pairs 124 and 125. The signal contacts 126 carry differential pair data signals at high speeds, such as 2 Gbits per second, 5 Gbits per second, 10 Gbits per second and the like. The differential pairs 124 and 125 are separated from one another by the ground contact 121. The floated contacts 122 and 123 are arranged on outer edges of the differential pairs 124 and 125, respectively.

Each signal, ground and floated contact tail 137, 134 and 133 curves below and outward from a contact passage 128. The contact passages 128 are separated by a series of sections 149 having beveled outer tips. The signal contacts 126 in each differential pair 124 and 125 are spaced apart by a width $W_D$ that includes the width of each signal contact 126 plus the space between the signal contacts 126.

The receptacle connector 100 also includes a shell (not shown) that covers the housing 110 and cavity 120. The end 103 of the receptacle connector 100 opposite the cavity 120 is received by a plug connector (not shown) having signal, ground and floated contacts (not shown) that connect to the signal contacts 126, ground contact 121, and floated contacts 122 and 123 respectively, through intermediate signal and ground portions (not shown), respectively. The plug connector, in turn, connects to an electrical cable (not shown) that allows signals to pass from the plug connector to the cable and ultimately to an electrical component (not shown), and vice versa.

Figure 2:
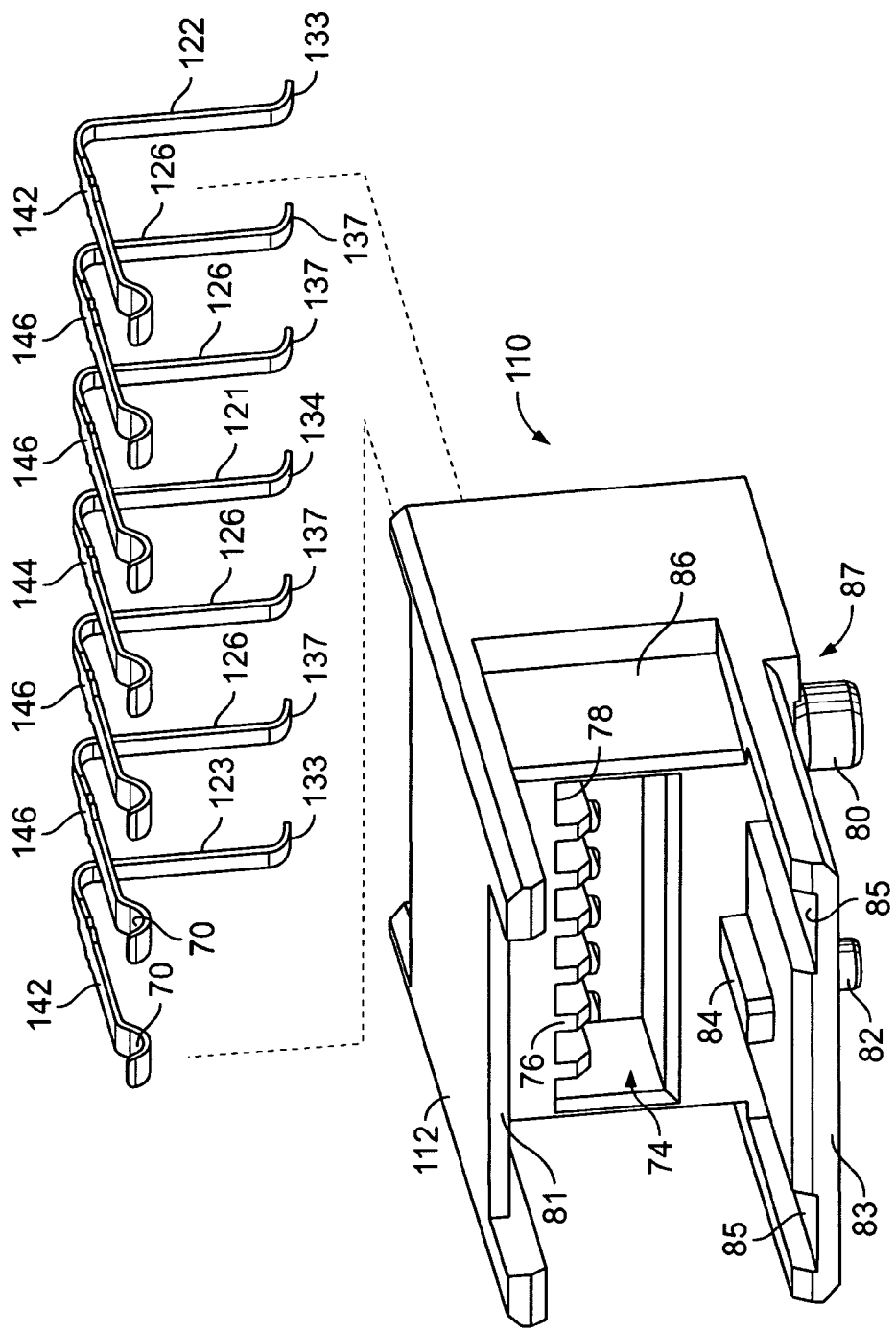
FIG. 2 illustrates the housing and the floated contacts, signal contacts and ground contact to be mounted therein in accordance with an embodiment of the present invention.

FIG. 2 illustrates the housing 110 and the floated contacts 122 and 123, the signal contacts 126, and ground contact 121 to be mounted therein in accordance with an embodiment of the present invention. The floated contact sections 142, ground contact section 144 and signal contact sections 146 each include a spoon-shaped contact region 70 on an outer end. The spoon-shaped contact regions 70 frictionally engage contact pads on a circuit board (not shown) on a plug. The arc shaped floated contact tails 133, ground contact tail 134, and signal contact tails 137 frictionally engage, through surface mounting, contact pads on a circuit board, such as circuit board 140, to which the receptacle shell (not shown) is securely mounted.

The housing 110 forms a mating connector including a plug receiving opening 74 that accepts the front edge of the circuit board. The opening 74 includes a plurality of projections 76 extending downward from an upper edge of the opening 74 to define recessed slots 78 therebetween. The slots 78 receive the floated contact sections 142, ground contact section 144 and signal contact sections 146. The housing 110 maintains the floated contacts 122 and 123, signal contacts 126, and ground contact 121 in a predetermined position and orientation by frictionally mounting the floated contact sections 142, ground contact section 144 and signal contact sections 146 in the slots 78 between the projections 76. A bottom surface 87 of the housing 110 includes pins 80 and 82 that are received through holes in the receptacle shell and holes 143 in the circuit board 140 (FIG. 1) to align, and secure in place, the housing 110 to the surface of the circuit board 140. The housing 110 includes upper and lower ledges 81 and 83 projecting forward from the main body 112. The lower ledge 83 includes grooves 85, and a polarizing key 84. The upper and lower ledges 81 and 83 cooperate to guide the plug assembly (not shown) into the opening 74. Opposite sides of the housing 110 include recessed notches 86 to receive guide wings on the plug assembly.

Figure 3:
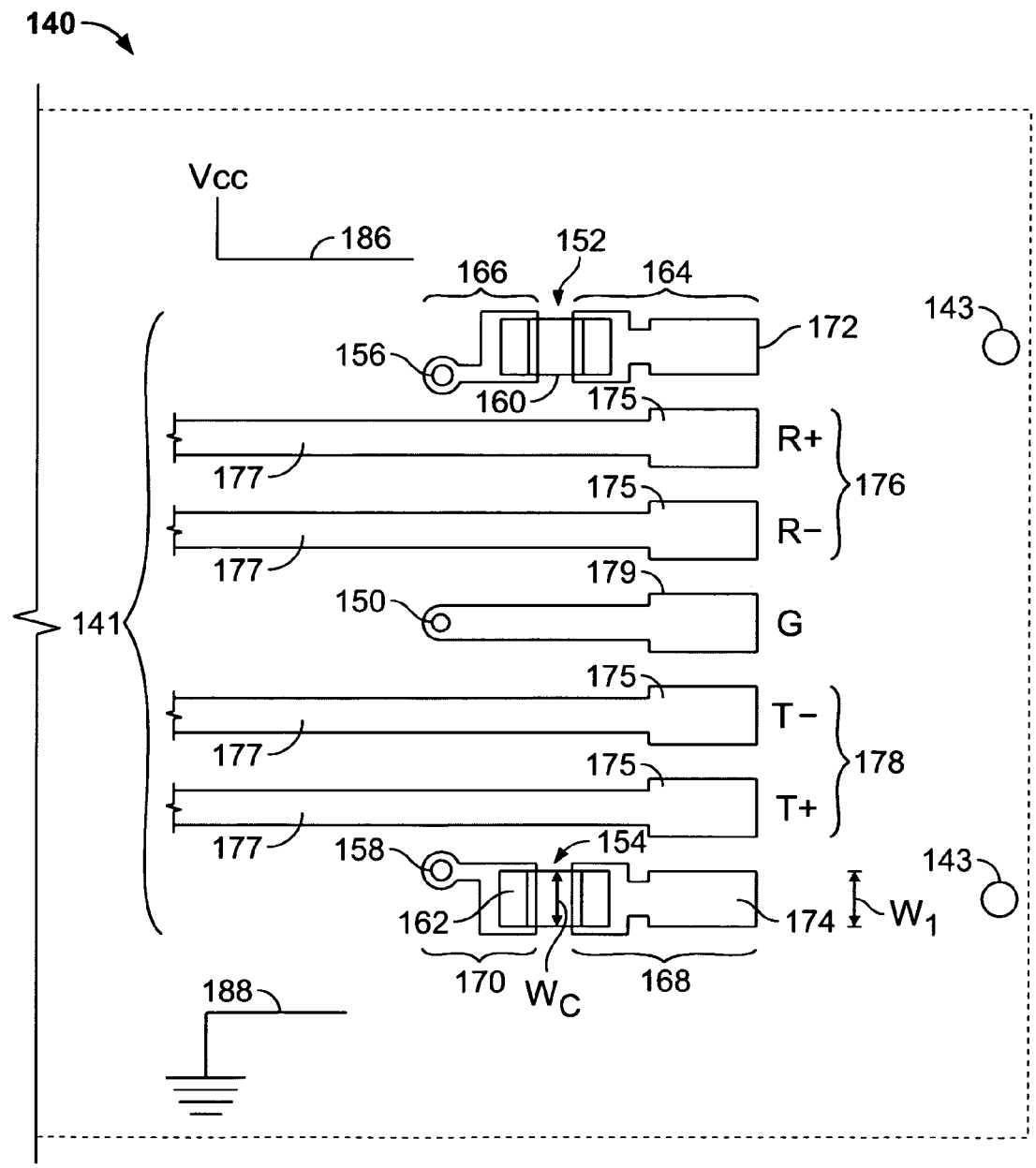
FIG. 3 illustrates a circuit board provided in accordance with an embodiment of the present invention.

FIG. 3 illustrates a circuit board 140 provided in accordance with an embodiment of the present invention. The circuit board 140 may be a mother board, a daughter card, a circuit board configured to be positioned in a connector plug (e.g., in plug assembly 42 in FIG. 4) and the like. The circuit board 140 includes a contact pattern 141. The contact pattern 141 may be positioned at an edge of the circuit board 140 or at an intermediate position on a surface of the circuit board 140 (remote from the edge). The contact pattern 141 may be positioned proximate an area configured to receive a receptacle connector, such as the receptacle connector 100 in FIG. 1.

The contact pattern 141 includes differential pairs 176 and 178, each of which is comprised of a pair of contact pads 175 that are located immediately adjacent one another. The contact pads 175 each are formed with corresponding signal traces 177 that extend from the contact pads 175 along the surface of the circuit board 140. By way of example, differential pair 176 may form pins 2 and 3 and communicate with the differential pair 124 for carrying received signals, while differential pair 178 constitutes pins 5 and 6 and communicates with the differential pair 125 for carrying transmitted signals. The differential pairs 176 and 178 are separated from one another by a ground contact 179 that is connected to a ground plane through a via 150. The outer side of differential pair 176 is bordered by floated or floating contact 172 (e.g., pin 1), while the outer side of differential pair 178 is bordered by floated or floating contact 174 (e.g., pin 7). The floated contacts 172 and 174 are configured to be joined to contacts 122 and 123 (FIG. 1).

One or both of the floated contacts 172 and 174, pins 1 and 7, may be connected to a power source, Vcc 186, which is used to provide power inside the connector, such as to power an active equalizer or buffer within the receptacle connector 100. For example, the Vcc 186 may be provided on the surface of the circuit board 140 or on one or more embedded layers within the circuit board 140 when the circuit board 140 constitutes a multi-layer circuit board. More than one power source may be provided. Optionally, floated contacts 172 and 174 may receive the same voltage level, different positive voltages, opposite voltage levels and the like. Optionally, one of the floated contacts 172 and 174 may receive voltage while the other does not.

Each of the floated contacts 172 and 174 has a break 152 and 154, respectively, electrically separating the floated contacts 172 and 174 into first and second component receiving pads 164 and 166 and first and second component receiving pads 168 and 170, respectively. Vias 156 and 158 are interconnected with the second component receiving pads 166 and 170, respectively, and a ground plane. The break 152 severs the ground path between first and second component receiving pads 164 and 166, and the break 154 severs the ground path between first and second component receiving pads 168 and 170. The ground plane may be located on the opposite side of the circuit board 140, or alternatively/additionally may be located in one or more embedded layers within the circuit board 140 when the circuit board 140 constitutes a multi-layer circuit board 140. Alternatively, a ground plane 188 may be co-planar with the surface of the circuit board 140, interconnecting with the second component receiving pads 166 and 170 by way of one or more traces.

Capacitor 160 is electrically joined to, and interconnects, the first and second component receiving pads 164 and 166, and capacitor 162 is electrically joined to, and interconnects, the first and second component receiving pads 168 and 170. By way of example only, the capacitors 160 and 162 may be 0603 sized capacitors having a value of 220 pF. The physical size and capacitance of the capacitors 160 and 162 may vary depending upon one or more of the physical size of, and voltage applied to, the floated contacts 172 and 174, the physical size of the traces being used, and the nature of the electrical signals being transmitted. The component receiving pads 164-170 are formed to create a large enough surface for mating with the capacitors 160 and 162.

The floated contacts 172 and 174 and capacitors 160 and 162 each have a width. For example, the floated contact 174 has a width $W_1$ and the capacitor 162 has a width $W_C$. The widths $W_1$ and $W_C$ may be the same, nearly the same or substantially equal to each other. Alternatively, the width $W_1$ could be narrower or wider than the width $W_C$.

The capacitors 160 and 162 act as "open circuits" with respect to DC voltages (Vcc 186) applied to or impressed on the floated contacts 172 and 174, respectively. When a DC voltage is applied to the floated contacts 172 and 174, the DC voltage is blocked from passing breaks 152 and 154, respectively. Thus, the capacitors 160 and 162 decouple DC voltage potentials applied to floated contacts 172 and 174 from the ground plane joined to vias 156 and 158 and/or the second component receiving pads 166 and 170, thereby allowing power supplies to be applied to the floated contacts 172 and 174.

The capacitors 160 and 162 act as "closed circuits" with respect to AC voltages, signals, and/or interference experienced by the component receiving pads 164, 166, 168 and 170. An AC voltage may be introduced into or impressed on the component receiving pads 164, 166, 168 and 170 from the floated contacts 122 and 123, or due to an EM field imbalance within the differential pairs 176 and 178. When the AC voltage is introduced, the capacitors 160 and 162 become closed circuits and join the floated contacts 172 and 174 to the ground plane 188 through the vias 156 and 158. In this manner, capacitors 160 and 162 create an AC return path and form a symmetric signal path and balanced ground environment for the differential pairs 176 and 178, and 124 and 125 (FIG. 1) with respect to signals conveyed through the differential pairs 176 and 178 to/from differential pairs 124 and 125.

By providing the AC return path, the ground path now has a low impedance return path that is symmetrical to the ground return path, created by the ground contact 179 and floated contacts 172 and 174. The differential signal integrity is maintained, thereby limiting insertion loss and reducing the potential for EMI.

Optionally, another type of component may be substituted for the capacitors 160 and 162, so long as the component (active or passive) functions as an open circuit for DC voltages and a closed circuit for AC voltages and interference.

Figure 4:
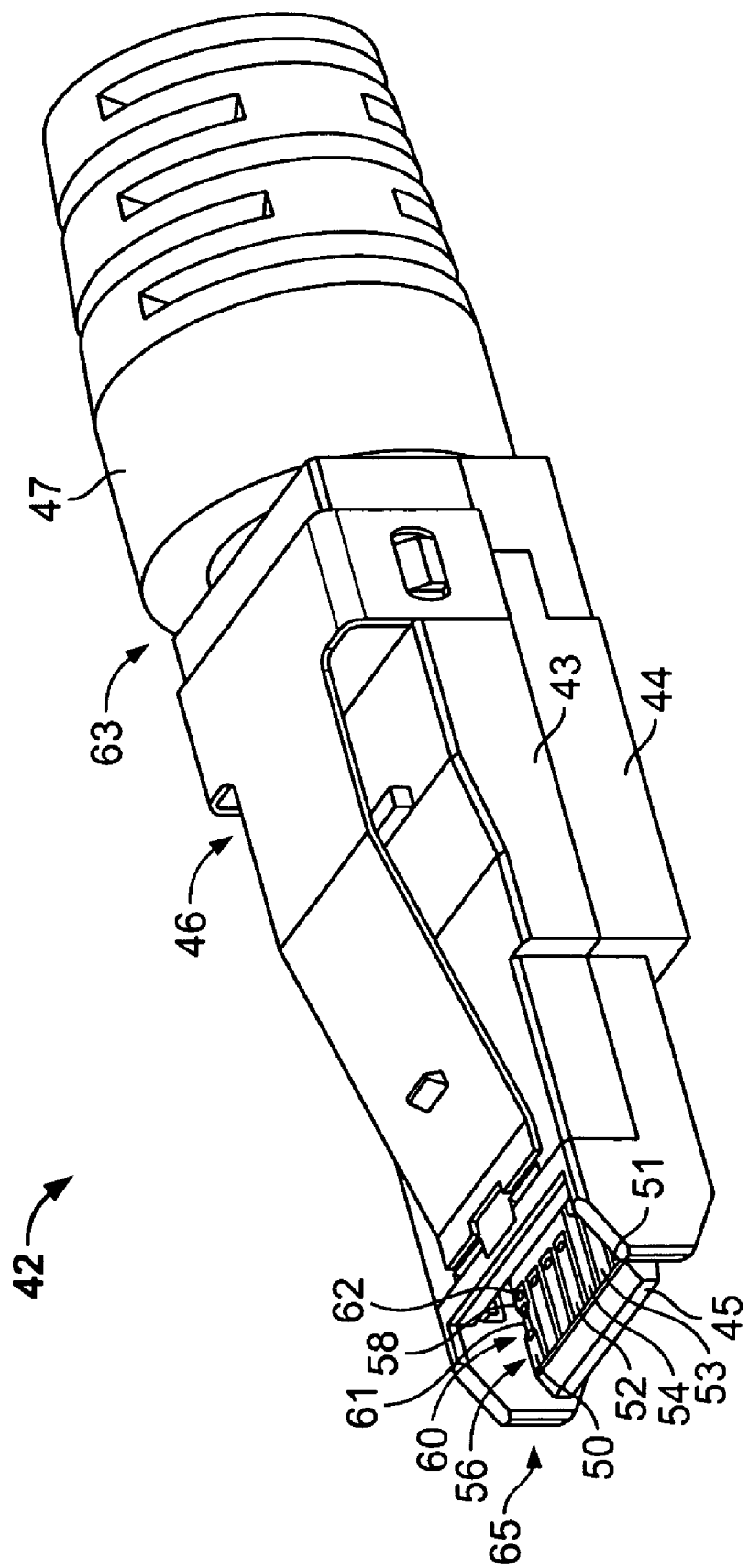
FIG. 4 illustrates a perspective view of a plug assembly in accordance with an embodiment of the present invention.

FIG. 4 illustrates a perspective view of a plug assembly 42 in accordance with an embodiment of the present invention. The plug assembly 42 includes an upper shell 43 and a lower shell 44 enclosing a circuit board 45. The circuit board 45 may be an equalization board or a buffer, for example. The plug assembly 42 is securely mounted at a cable receiving end 63 to the end of a cable (not shown) capable of transmitting high speed serial data, such as a quad cable and the like. A strain relief 47 is secured to the back end of the upper and lower shells 43 and 44 to protect the interconnection between the plug assembly 42 and the cable.

A mating end 65 of the plug assembly 42 is inserted into the plug receiving opening 74 (FIG. 2) of the housing 110. The plug assembly 42 includes a latch assembly 46 removably mounted to the upper and lower shells 43 and 44 for securely interconnecting the plug assembly 42 and the housing 110.

The circuit board 45 has floated contacts 50 and 51 which provide connection to the floated contacts 122 and 123, respectively. A ground contact 52 provides connection to the ground contact 121. Signal contacts 53 and 54 are arranged to form a differential pair to connect to the differential pair 124. In the embodiment illustrated in FIG. 4, only one differential pair is used. It should be understood that two differential pairs may be formed as illustrated below.

The floated contacts 50 and 51 within the plug assembly 42 on the circuit board 45 are divided into first and second component receiving pads 56 and 58 with a break 60 therebetween. A via 62 on the second component receiving pad 58 may be interconnected with a ground plane (not shown) as discussed previously. A capacitor 61 interconnects the first and second component receiving pads 56 and 58, providing an open circuit with the ground plane with respect to DC signal impressed on the first component receiving pad 56 and providing a closed circuit with the ground plane with respect to AC interference and/or signals impressed on the floated contacts 50 and 51.

Figure 5:
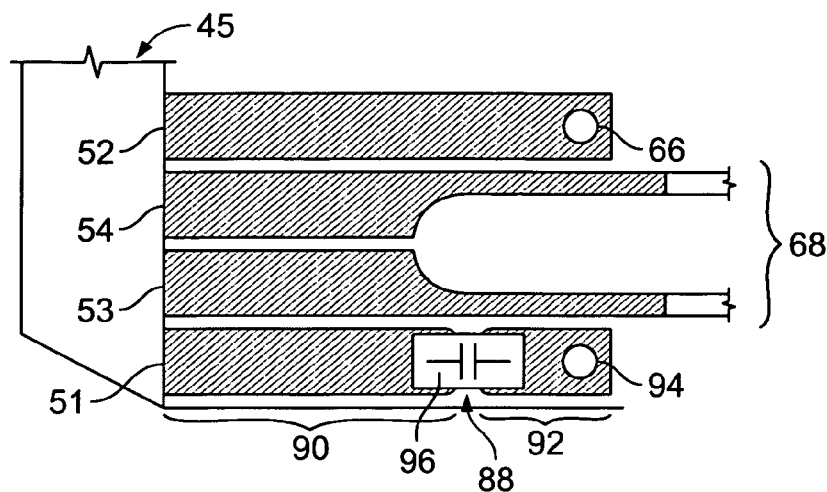
FIG. 5 illustrates a portion of the circuit board of the plug assembly having a single differential pair and using a capacitor to form a symmetrical ground return in accordance with an embodiment of the present invention.

FIG. 5 illustrates a portion of the circuit board 45 of the plug assembly 42 having a single differential pair and using a capacitor 96 to form a symmetrical ground return in accordance with an embodiment of the present invention. Although a single differential pair is illustrated, it should be understood that a second differential pair may be used. In addition, a component or components other than a capacitor 96 may be used.

Figure 6:
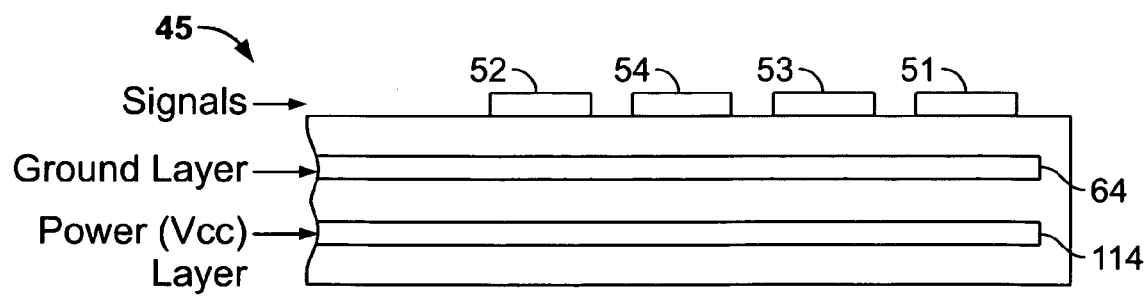
FIG. 6 illustrates layers or planes within the circuit board in accordance with an embodiment of the present invention.

FIG. 6 illustrates layers or planes within the circuit board 45 in accordance with an embodiment of the present invention. It should be understood that more layers within the circuit board 45 may be used. The floated contact 51, ground contact 52, and signal contacts 53 and 54 discussed previously in FIG. 4 are illustrated. FIGS. 5 and 6 will be discussed together.

The ground contact 52 is connected to a ground layer 64 within the circuit board 45 using via 66. The signal contacts 53 and 54 form a differential pair 68. A break 88 is formed in the floated contact 51, creating first and second component receiving pads 90 and 92. A via 94 is connected to the ground layer 64, electrically joining the second component receiving pad 92 to the ground layer 64. A capacitor 96 interconnects the first and second component receiving pads 90 and 92 of the floated contact 51. The floated contact 51 may be used to provide power to the receptacle connector 100, and the capacitor 96 completes an AC return path, restoring symmetry to the circuit.

Figure 7:
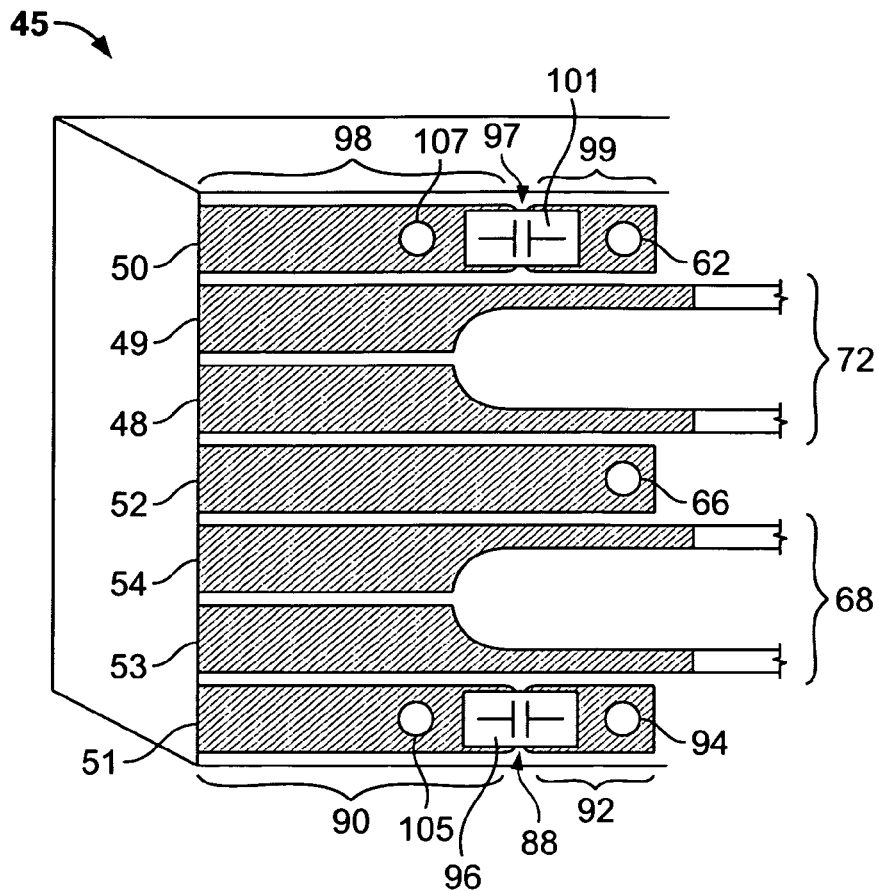
FIG. 7 illustrates the circuit board of the plug assembly having two differential pairs and connections to a power layer in accordance with an embodiment of the present invention.

FIG. 7 illustrates the circuit board 45 of the plug assembly 42 having two differential pairs and connections to a power layer in accordance with an embodiment of the present invention. Signal contacts 48 and 49 are arranged to form a differential pair 72. The floated contact 51 has the break 88 separating the first and second component receiving pads 90 and 92, and the capacitor 96 has been joined to the first and second component receiving pads 90 and 92 to create the AC ground return path as previously discussed.

Break 97 separates the floated contact 50 into first and second component receiving pads 98 and 99. A capacitor 101 joins the first and second component receiving pads 98 and 99, forming an AC ground return path and restoring symmetry to the differential pair 72.

A via 105 interconnects the first component receiving pad 90 of the floated contact 51 with a power layer, Vcc 114, within the circuit board 45. Similarly, a via 107 interconnects the first component receiving pad 98 of the floated contact 50 with Vcc 114. It should be understood that either one or both of the floated contacts 50 and 51 may be connected to Vcc 114. Alternatively, one or both of the floated contacts 50 and 51 may be connected to a different power layer or source, such as Vcc 186 (FIG. 3) provided on the surface of the circuit board 45.

Figure 8:
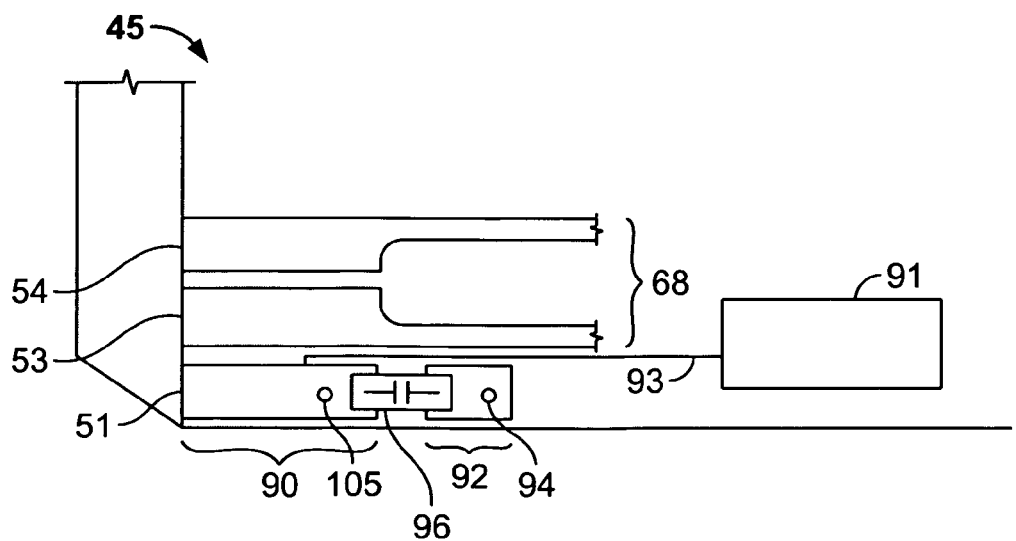
FIG. 8 illustrates a portion of the circuit board having power supplied to an active component within the plug assembly in accordance with an embodiment of the present invention.

FIG. 8 illustrates a portion of the circuit board 45 having power supplied to an active component within the plug assembly 42 in accordance with an embodiment of the present invention. An active component 91 is interconnected with the first component receiving pad 90 of the floated contact 51 with a trace 93. Therefore, Vcc power is supplied to the active component 91 as the first component receiving pad 90 is interconnected through the via 105 with Vcc 114. It should be understood that more than one active component may be connected to, and receive power from, the first component receiving pads 90 and 98.

Figure 9:
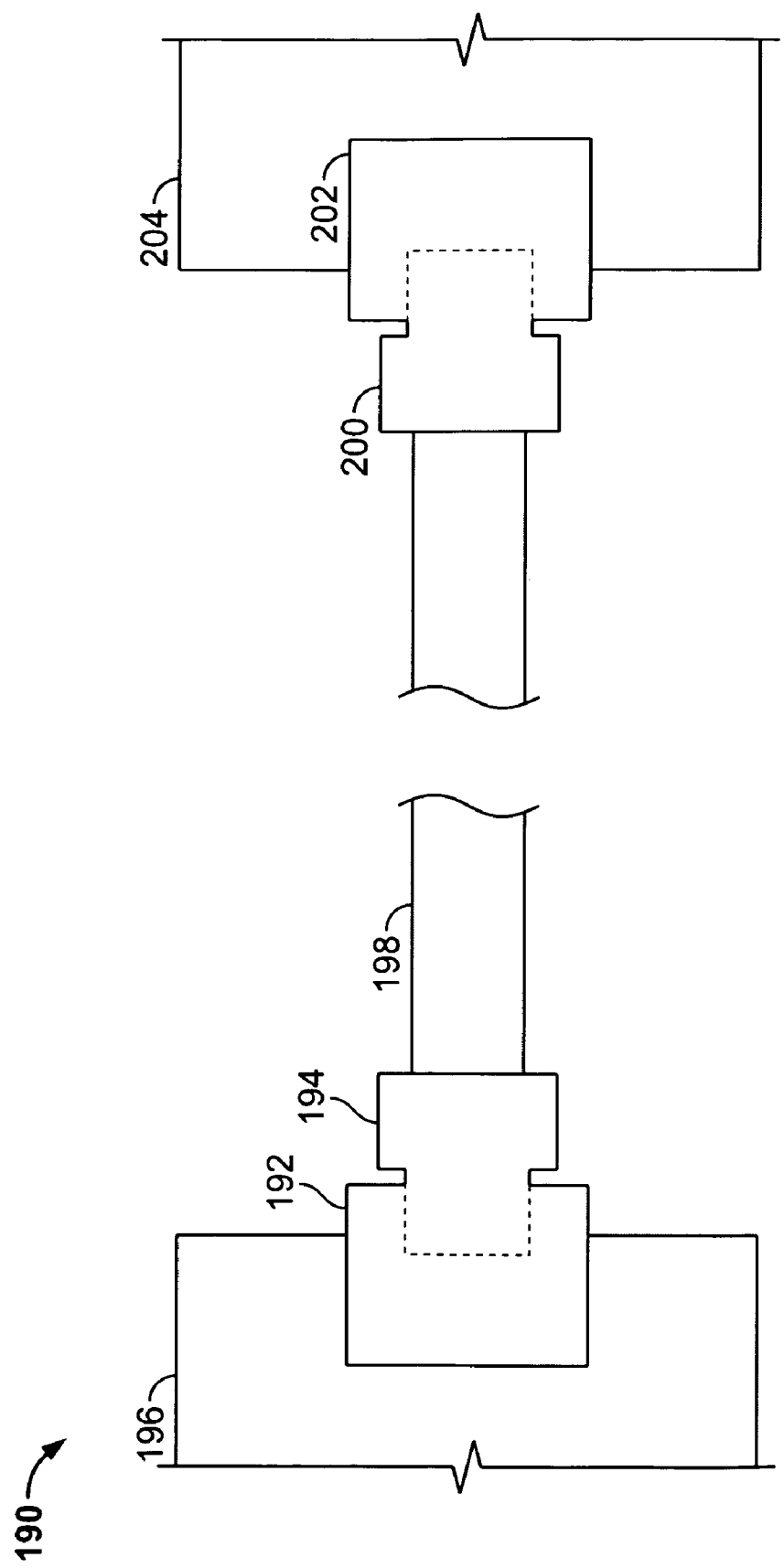
FIG. 9 illustrates a cable assembly in accordance with an embodiment of the present invention.

FIG. 9 illustrates a cable assembly 190 in accordance with an embodiment of the present invention. The cable assembly 190 may be an HSSDC or an HSSDC2 cable assembly, for example. A receptacle or connector 192 receives a plug assembly 194 and is attached to a circuit board 196. A cable 198 interconnects the plug assembly 194 with plug assembly 200, which is received by a connector 202 attached to a circuit board 204. Each of the connectors 192 and 202 and plug assemblies 194 and 200 has a capacitor interconnecting first and second component receiving pads of the floated contacts on outer sides of the differential pairs as discussed previously.

While the invention has been described in terms of various specific embodiments, those skilled in the art will recognize that the invention can be practiced with modification within the spirit and scope of the claims.

What is claimed is:

1. A circuit board, comprising:
   first and second signal contacts associated as a differential pair;
   a ground plane;
   a ground contact located immediately adjacent said first signal contact, said ground contact being joined directly to said ground plane;
   a floated contact located immediately adjacent said second signal contact; and
   a component interconnecting said floated contact to said ground plane, said component forming an open circuit when a DC signal is impressed on said floated contact, and said component forming a closed circuit when AC interference is impressed on said floated contact.

2. The circuit board of claim 1, wherein said component constitutes a capacitor.

3. The circuit board of claim 1, further comprising first and second component receiving pads electrically separated from one another and provided on a surface of the circuit board, said first component receiving pad being electrically joined to said floated contact, said second component receiving pad being electrically joined to said ground plane, said component being joined to and interconnecting said first and second component receiving pads.

4. The circuit board of claim 1, further comprising first and second differential pairs and first and second floated contacts, said first and second differential pairs being located between said floated contacts, said ground contact being located between said first and second differential pairs.

5. The circuit board of claim 1, wherein said floated contact is configured to convey power.

6. The circuit board of claim 1, further comprising signal traces joined to, and extending from, said first and second signal contacts.

7. The circuit board of claim 1, wherein said floated contact and said component have substantially equal widths.

8. The circuit board of claim 1, wherein said floated contact, said component and said ground contact provide a symmetrical signal return path.

9. The circuit board of claim 1, further comprising a connector receptacle mounted to a surface of said circuit board, said connector receptacle having receptacle signal contacts engaging said first and second signal contacts, and a receptacle floated contact engaging said floated contact.

10. The circuit board of claim 1, further comprising a circuit board body having said first and second signal contacts, ground contact and floated contact provided on one side thereof, said circuit board body being configured to be inserted into an interior cavity of a plug connector housing.

* * * * *